(12) United States Patent
Weng et al.

(10) Patent No.: US 6,226,772 B1
(45) Date of Patent: May 1, 2001

(54) PIPELINED COMBINED SYSTEM FOR PRODUCING ERROR CORRECTION CODE SYMBOLS AND ERROR SYNDROMES FOR LARGE ECC REDUNDANCY

(76) Inventors: Lih-Jyh Weng, 95 Brookdale Cir., Shrewsbury, MA (US) 01545; Diana Langer, 169 W. Main St., Northboro, MA (US) 01532

( * ) Notice: Subject to any disclaimer, the term of this patent is extended or adjusted under 35 U.S.C. 154(b) by 0 days.

(21) Appl. No.: 09/187,144

(22) Filed: Nov. 6, 1998

(51) Int. Cl.[7] .................................................. H03M 13/00
(52) U.S. Cl. ......................... 714/781; 714/758; 714/784; 714/785; 708/492
(58) Field of Search .................................. 714/781–785, 714/758, 759; 708/492

(56) References Cited

U.S. PATENT DOCUMENTS

| | | | |
|---|---|---|---|
| 4,675,869 | * 6/1987 | Driessen | 714/759 |
| 5,107,503 | * 4/1992 | Riggle et al. | 714/784 |
| 5,887,005 | * 3/1999 | Sharma | 714/784 |
| 5,901,158 | * 5/1999 | Weng et al. | 714/785 |
| 5,983,383 | * 11/1999 | Wolf | 714/755 |

OTHER PUBLICATIONS

Gerhard Fettweis and Martin Hassner, Combined Reed–Solomon Encoder and Syndrome Generator with Small Hardware Complexity, IEEE, 1992.*

* cited by examiner

Primary Examiner—Emmanuel L. Moise
(74) Attorney, Agent, or Firm—Cesari & McKenna

(57) ABSTRACT

An n-stage pipelined combined encoder and syndrome generator system includes n stages that are essentially identical. Each of the stages includes two associated delay circuits, namely, a first delay circuit in a chain of feedback adders that operate as a feedback path during encoding, and a second delay circuit in a data input line. During encoding operations, the delay circuits in the feedback adder chain segment the chain of j feedback adders into n stages of j/n adders, and the delay circuits in the data input line delay the data symbols by the latencies associated with the respective stages. The delay circuits thus simultaneously provide to the various stages the corresponding data symbols and propagating sums. After the last data symbol is encoded, the ECC symbols are available after a time lag associated with the j/n adders in the last stage. During syndrome generation operations, the feedback adders are essentially decoupled from one another by AND gates that are included in the feedback path and switches in the data input line bypass the delay circuits, to avoid introducing latency into the syndrome generation operations.

14 Claims, 3 Drawing Sheets

US 6,226,772 B1

PIPELINED COMBINED SYSTEM FOR PRODUCING ERROR CORRECTION CODE SYMBOLS AND ERROR SYNDROMES FOR LARGE ECC REDUNDANCY

FIELD OF INVENTION

The invention relates generally to error correction systems and, more particularly, to systems that use hardware that both encodes the data and produces associated error syndromes.

BACKGROUND OF THE INVENTION

Encoders for encoding data in accordance with a Reed-Solomon error correction code ("ECC") to produce ECC symbols are well known. A conventional encoder that produces "j" ECC symbols includes j Galois Field multipliers. The Galois Field multipliers are associated, respectively, with the j roots of the code generator polynomial, g(x). The encoder also includes feedback adders that combine the products associated with a given data symbol with the results of the encoding of the previous data symbol, and j registers that hold the sums produced by the adders. At the end of the encoding, the j registers contain the ECC symbols.

When a data symbol is supplied to the encoder the symbol is combined with the contents of a last register and the result is supplied to the Galois Field multipliers, which simultaneously multiply the results by the roots of g(x). The product produced by a first Galois Field multiplier updates the first register. The products produced by the remaining Galois Field multipliers are combined, respectively, with the contents of the remaining registers and the results are used to update these registers. The last register is thus updated with the sum of (i) the product produced by the last Galois Field multiplier and (ii) the contents of the preceding register. The updated contents of the last register are then combined with the next data symbol and the result is fed back to the Galois Field multipliers, with the remaining feedback adders adding the products produced by the multipliers to the results of the encoding of the previous data symbol and supplying the sums to update the registers, and so forth. As soon as the last data symbol is encoded, the ECC symbols are read from or clocked out of the j registers and concatenated with the data symbols to produce a data codeword that is transmitted or stored, as appropriate. With such an encoder the latency is the time associated with a single feedback adder, since the adders operate in parallel to produce the updated sums for the registers. Accordingly, the latency is essentially non-existent.

As part of a decoding operation a decoding system manipulates the data symbols of a data code word to produce error syndromes that are then used to locate errors in the data. A conventional error syndrome generator includes j sets of associated update adders, Galois Field multipliers and registers, with each set operating simultaneously and essentially separately to produce the associated error syndrome. Each update adder adds the product produced by the associated Galois Field multiplier to the next data symbol, and updates the associated register with the sum. Each Galois Field multiplier then multiplies the contents of the register by a root of an error syndrome generator polynomial that is associated with the ECC and supplies the product to the associated update adder. The update adder adds the product to the next data symbol, and supplies the sum to the associated register, and so forth. After the last data symbol is supplied to the syndrome generator and added to the products produced by the respective Galois Field multipliers to update the registers, the j registers contain the j error syndromes.

The Galois Field multipliers that are included in the encoder and the syndrome generator are relatively complex components. An article by Gerhard Fettweis and Martin Hassner, *A Combined Reed-Solomon Encoder And Syndrome Generator With Small Hardware Complexity*, published by IEEE in 1992 describes hardware that uses the same Galois Field multipliers for both the encoding and the syndrome generation. The combined hardware thus uses one-half the number of multipliers that are required for separate encoder and syndrome generator hardware. The article is incorporated herein by reference.

The combined hardware described in the article includes j sets of associated registers, Galois Field multipliers, update adders and feedback adders. The j registers hold updated sums produced by the j associated update adders. Each Galois Field multiplier multiplies the contents of the associated register by a root of the generator polynomial and supplies the product to the associated feedback adder. During encoding operations, an associated AND gate passes to the adder the sum produced by the previous feedback adder. The adder then adds the propagating sum to the product and passes the result both to the associated update adder and through a next AND gate to the next feedback adder. The next feedback adder adds the propagating sum to the product produced by the associated multiplier, and the result is supplied to the associated update adder and through the next AND gate to a next feedback adder, and so forth. The feedback adders and associated AND gates thus form a feedback path in which the adders operate as a chain. During syndrome generation operations, the AND gates essentially break the chain of adders by blocking the propagation of a sum from one feedback adder to the next, and the j sets of associated registers, multipliers and adders operate separately to produce the j error syndromes.

With the combined hardware there is a latency in the encoding operations that corresponds to the time it takes the propagating sum to pass through the chain of j feedback adders. If the chain of adders is long, it restricts the speed with which the data is encoded by setting a minimum time for a clock cycle, since the propagating sum must pass through the entire chain in one clock cycle.

The Fettweis-Hassner article discusses the latency problem and describes a two-stage pipelined circuit that essentially cuts the chain of j feedback adders in half. In the first stage of the two-stage circuit the Galois Field multipliers associated with the first j/2 roots of the generator polynomial are positioned between the update adders and the associated registers. An update adder thus adds a data symbol to the results of the encoding of a previous data symbol, and the associated Galois Field multiplier multiplies the sum by a root of the generator polynomial. The product produced by the Galois Field multiplier is supplied to the associated feedback adder, which adds the product to the sum provided by the previous feedback adder. The resulting sum both updates the associated register and propagates through the remaining adders in the stage and into a delay circuit.

During the $n^{th}$ clock cycle, the $i^{th}$ update adder in the first stage produces the sum $$Y_{n,i} = (r_{n-1,i} + d_n)$$

where $r_{n-1,i}$ is the contents of the associated register, $r_{n-1,i} = p_{n-1,i}$ and $p_{n-1,i}$ is the propagating sum produced by the associated feedback adder in the previous clock cycle. The sum is then multiplied by a root $a^i$ of the generator polynomial and the product $$Z_{n,i} = \alpha^{i} * (r_{n-1,i} + d_n)$$

is then supplied to the feedback adder and added into the next propagating sum, $P_{n,i-1}$. The result $P_{n,i}$ both propagates to the next feedback adder and updates the associated register, such that $r_{n,i}=p_{n,i}$. The sum $p_{n,j/2-1}$ produced by the last feedback adder in the stage is held in the delay circuit until the next clock cycle.

When a next data symbol is supplied to the hardware, the delay circuit supplies the propagating sum associated with the previous data symbol to the first feedback adder in the second stage. In the second stage the registers are positioned between the update adders and the Galois Field multipliers, such that the multipliers produce products associated with the previous data symbol, and the update adders provide to the registers updated sums associated with the data symbol that is then being supplied to the hardware. Each multiplier in the second stage multiplies the contents of the associated register, by one of the last j/2 roots of the generator polynomial and supplies the product to the associated feedback adder. The first feedback adder in the second stage adds the product produced by the associated Galois Field multiplier to the sum $p_{n,j/2-1}$ supplied by the delay circuit. The result $p_{n,j/2}$ is then supplied both to the associated update adder and to the next feedback adder in the chain, such that the propagating sum continues to pass through the chain of j/2 feedback adders in the second stage.

During the $n+1^{st}$ clock cycle, the $m^{th}$ register in the second stage contains the sum produced by the update adder in the previous clock cycle $r_{n-1,m}=P_{n-1,m}+d_n$. The sum is then multiplied by the $m^{th}$ root of the generator polynomial to produce the product $$Z_{n,m}=\alpha^{m}*(P_{n-1,m}+d_n)$$

which is supplied to the associated feedback adder and added into the propagating delayed sum $P_{n,m-1}$. The result $P_{n,m}$ propagates to the next feedback adder and to the associated update adder. The update adder adds the sum $P_{n,m}$ to the next data symbol $d_{n+1}$ and the result $r_{n+1,m}=P_{n,m}+d_{n+1}$ is held in the associated register. The last feedback adder in the system thus produces the propagating sum $P_{n,j}$ during the $n+1^{st}$ clock cycle, and the two stages operate as a pipeline.

The two-stage pipeline circuit works well for encoding operations that use ECCs that detect or correct relatively few errors, that is, ECCs that produce relatively small numbers of ECC symbols. The associated latency is the time it takes the propagating sum to pass through the j/2 adders in the second stage, or one-half the latency of the single-stage system. The latency is unacceptable, however, for systems that require ECCs that use greater numbers of ECC symbols. As the Fettweis-Hassner article explains, the chain of adders in the feedback path prevents the coupled stages described above from being used for further pipelining, and complicates efforts to use the combined hardware for relatively long ECCs.

SUMMARY OF THE INVENTION

The invention is an n-stage pipelined combined encoder and syndrome generator system in which the stages are essentially identical. Each of the stages include two associated delay circuits, namely, a first delay circuit in a chain of feedback adders that operate as a feedback path during encoding, and a second delay circuit in a data input line. During encoding operations, the delay circuits in the feedback adder chain segment the chain of j feedback adders into n stages of j/n adders, and the delay circuits in the data input line delay the data symbols by the latencies associated with the respective stages. The delay circuits thus simultaneously provide to the various stages the corresponding data symbols and propagating sums. After the last data symbol is encoded, the ECC symbols are available after a time lag associated with the j/n adders in the last stage. Since any number of stages can be included in the hardware, the length of the time lag per stage, that is, the latency, can be appropriately adjusted to meet system requirements.

During syndrome generation operations the feedback adders are essentially decoupled from one another by AND gates that are included in the feedback path. Also, switches in the data input line pass the data symbols around the delay circuits in the line, to avoid introducing latency into the syndrome generation operations.

More specifically, each stage includes j/n Galois Field multipliers. Each multiplier is positioned between an associated update adder and an associated register. The update adder adds the data symbol supplied to the stage to the results of the manipulation of a previous data symbol to produce an update sum. The Galois Field multiplier then multiplies the update sum by a root of the generator polynomial and supplies the product to the associated feedback adder.

During an encoding operation the feedback adder adds the product to the sum produced by the previous feedback adder in the chain, and supplies the result both to the associated register and through an AND gate to the next feedback adder in the chain, and so forth. While the propagating sum passes through the chain of j/n feedback adders in the stage, the delay circuit in the data input line holds the corresponding data symbol. The last feedback adder in the stage provides the propagating sum to the delay circuit in the feedback path.

At the start of the next clock cycle, the delay circuit in the data input line provides the data symbol to the update adders in the next stage, and the delay circuit in the feedback path passes the corresponding propagating sum to the first feedback adder in the next stage, that is, to the next feedback adder in the chain. At the same time, the delay circuits in the previous stage provide the next data symbol and the corresponding propagated sum to this stage, and so forth. The stages thus operate in a pipeline in which each stage encodes a string of data symbols and produces corresponding propagating sums that are then provided to the successive stages. When the last data symbol is encoded in the last stage of the pipeline, the j/n registers in the last stage are updated with the corresponding updated sums. Once the last register in the last stage is updated, and thus, the corresponding propagating sum has passed through the entire chain of feedback adders, the j ECC symbols can be clocked from the hardware. The ECC symbols can then be included in the data code word. The latency is thus the time lag associated with the j/n adders in the last stage.

The arrangement of adders, multipliers and registers in each stage is identical. Accordingly, the pipelined system may include any number of stages, with the processing time per stage determined by the number of feedback adders per stage. The number of stages is thus selected to control the length of the time lag, or latency, and the hardware may be set up to accommodate ECCs of any length.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
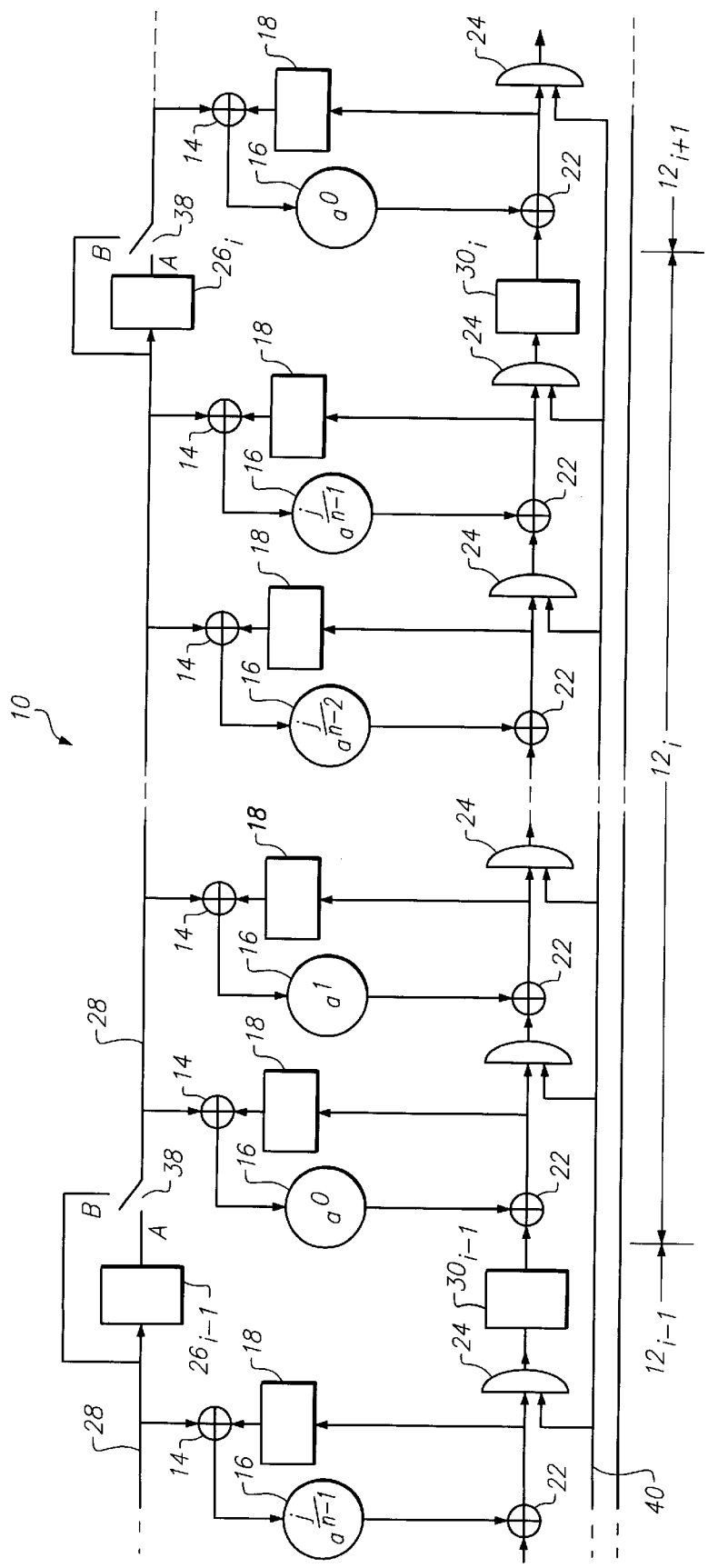
FIG. 1 is a functional block diagram of a stage of an n-stage system constructed in accordance with the invention.

Referring to FIG. 1, a combined encoder and syndrome generator 10 that produces "j" ECC symbols and error syndromes has "n" stages that are essentially identical to the stage $12_i$ depicted in detail in the drawing. Each stage $12_i$ includes j/n Galois Field multipliers 16 that are positioned between j/n update adders 14 and j/n registers 18, and a feedback path 20 that includes j/n feedback adders 22 that are connected through AND gates 24 to operate during the encoding operations as part of a chain of j adders. While a sum propagates through the chain of j/n feedback adders 22 in the stage, a delay circuit 26 in a data input line 28 holds the corresponding data symbol, as discussed in more detail below.

A b-bit data symbol supplied by the delay circuit $26_{i-1}$ of the previous stage $12_{i-1}$ enters the stage $12_i$ on the b-bit wide data input line 28 and is supplied simultaneously to update adders $14_i$ and the delay circuit $26_i$, with the switch $38_i$ in position A. Each adder $14_i$ adds the data symbol to the contents of an associated register $18_i$ and provides a sum to the associated Galois Field multiplier $16_i$. Each Galois Field multiplier $16_i$ multiplies the sum by a root of the generator polynomial associated with the ECC and supplies the product to the associated feedback adder $22_i$.

The first feedback adder $22_i$ adds the product produced by the associated multiplier to the propagating sum supplied by the delay circuit $30_{i-1}$ in the previous stage, and supplies the result to the associated register $16_i$ and to the first AND gate $24_i$ in the stage. During encoding operations, a control signal on line 40 is asserted and the AND gate $24_i$ passes the sum produced by the first feedback adder to the second feedback adder $22_i$ in the stage. The second feedback adder $22_i$ adds the propagating sum to the product produced by the associated Galois Field multiplier $16_i$, and supplies the result to both the associated register $18_i$ and to the next AND gate 24 in the feedback path 20. This next AND gate $24_i$, in turn, supplies the propagating sum to a next feedback adder $22_i$, which then adds the sum to the product produced by the associated Galois Field multiplier $16_i$. The sum produced by this next feedback adder is supplied both to a next AND gate $24_i$ and to the associated register $18_i$, and so forth. The propagating sum thus continues to propagate along the chain of j/n feedback adders in the stage until the sum produced by the last feedback adder $22_i$ in the stage passes through the last AND gate $24_i$ to the delay circuit $30_i$.

During a next clock cycle, the delay circuits $26_i$ and $30_i$ pass the corresponding data symbol and propagating sum to a next stage. In this stage the data symbol is combined with the results of the encoding of previous data symbols, multiplied by the associated roots of the generator polynomial and included in the propagating sum, as the sum continues to pass through this next stage to the delay circuit $30_{i+1}$ included therein. As discussed above, the data symbol is at the same time held in the delay circuit $26_{i+1}$ of the stage. During a successive clock cycle the data symbol and the corresponding propagating sum are supplied by the delay circuits $26_{i+1}$, and $30_{i+1}$, respectively, to a successive stage, and so forth, until the propagating sum passes through the entire pipeline. As the last data symbol is encoded by the last stage, the corresponding propagating sum passes through the last set of j/n feedback adders $22_n$, to update the last set of j/n registers $18_n$. When the updating is complete, the ECC symbols can then be clocked out the system, as discussed below with reference to FIG. 2. The time lag between the encoding of the last data symbol and the availability of the first ECC symbol is thus the propagation time through the last j/n adders.

During syndrome generation, the switches 38 in the data input line 28 are moved to position B, such that the data symbols bypass the delay circuits 26. The data symbols are thus supplied essentially simultaneously to all of the update adders 14 in the system. Each adder 14 adds the data symbol to the contents of the associated register 18 and supplies the sum to the associated Galois Field multiplier 16. As discussed, the Galois Field multiplier multiplies the sum by a root of the generator polynomial and supplies the product to an associated feedback adder 22. For syndrome generation, the control signal on line 40 is deasserted, such that the AND gates 24 supply zero-valued signals to the feedback adders 22. This effectively breaks the chain of adders, such that each feedback adder 22 passes the product produced by the associated Galois Field multiplier 16 unchanged to the associated register 18. A next data symbol is then supplied to the update adders, and so forth. After the last data symbol is supplied to the system, the j registers 18 contain the j error syndromes.

Figure 2:
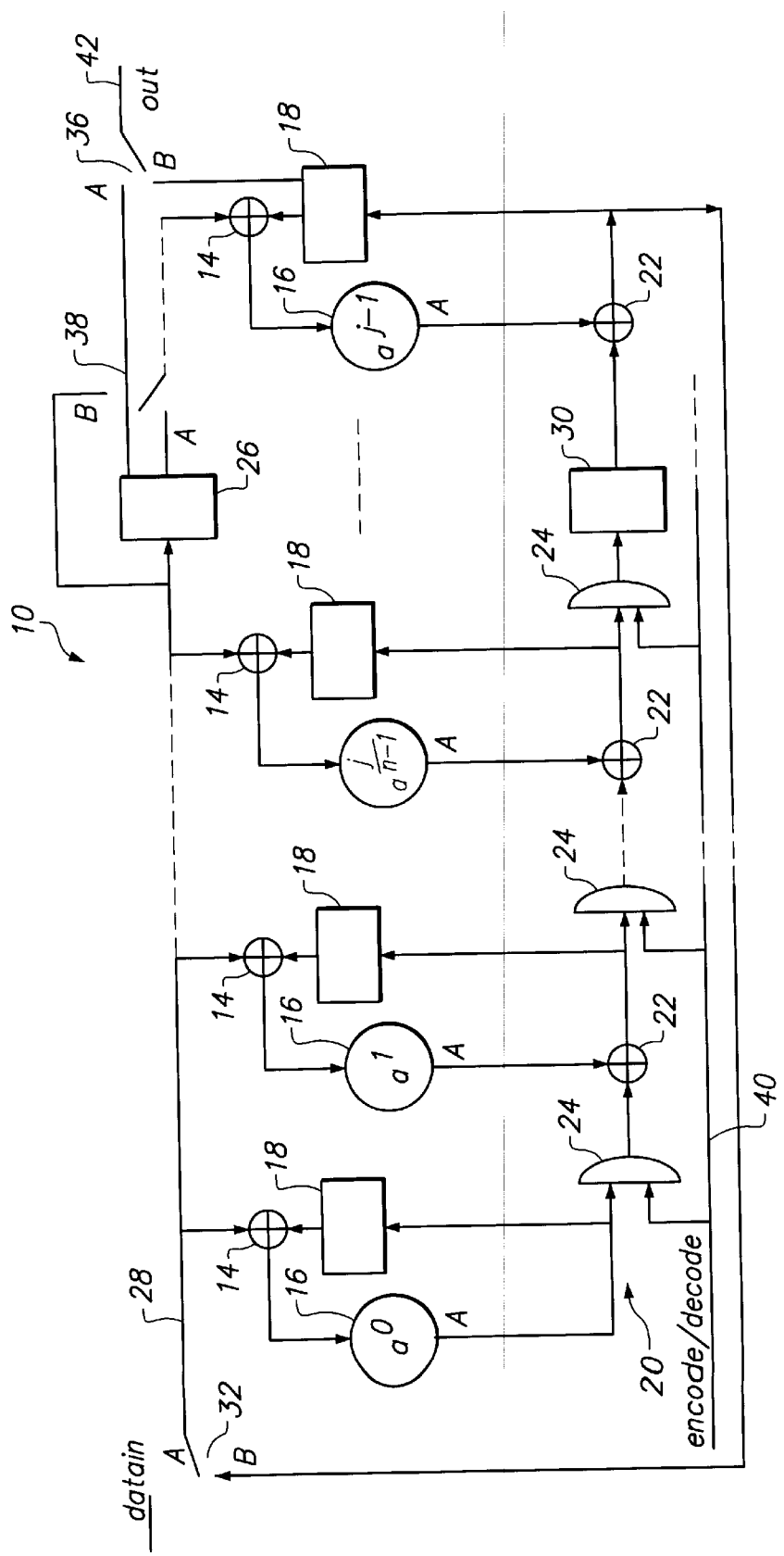
FIG. 2 is a functional block diagram of the n-stage system.

Referring now also to FIG. 2, the first stage $12_0$ of the system includes a switch 32 that is in position A when data symbols are supplied to the system for an encoding operation, and moved to position B when the ECC symbols are being clocked out of the system. In position B, the switch 32 provides to the input line 28, and thus, to the update adders 14 in the first stage, the sum produced by the last feedback adder in the chain of adders. As the system is clocked, the ECC symbols follow the data symbols out of the last stage of the system. When the data symbols are supplied to the system, a switch 36 is in position A to provide the data symbols to the output line 42. Thereafter, the switch 36 is moved to position 13 to supply the ECC symbols to the output line 42.

For syndrome generation operations, the switch 32 remains in position A.

As shown in the drawing, the product produced by the first Galois Field multiplier in the first stage is supplied directly to the first register $18_0$. The product is also supplied to the first AND gate $24_0$, which passes the product to the first feedback adder in the chain of j adders.

Figure 3:
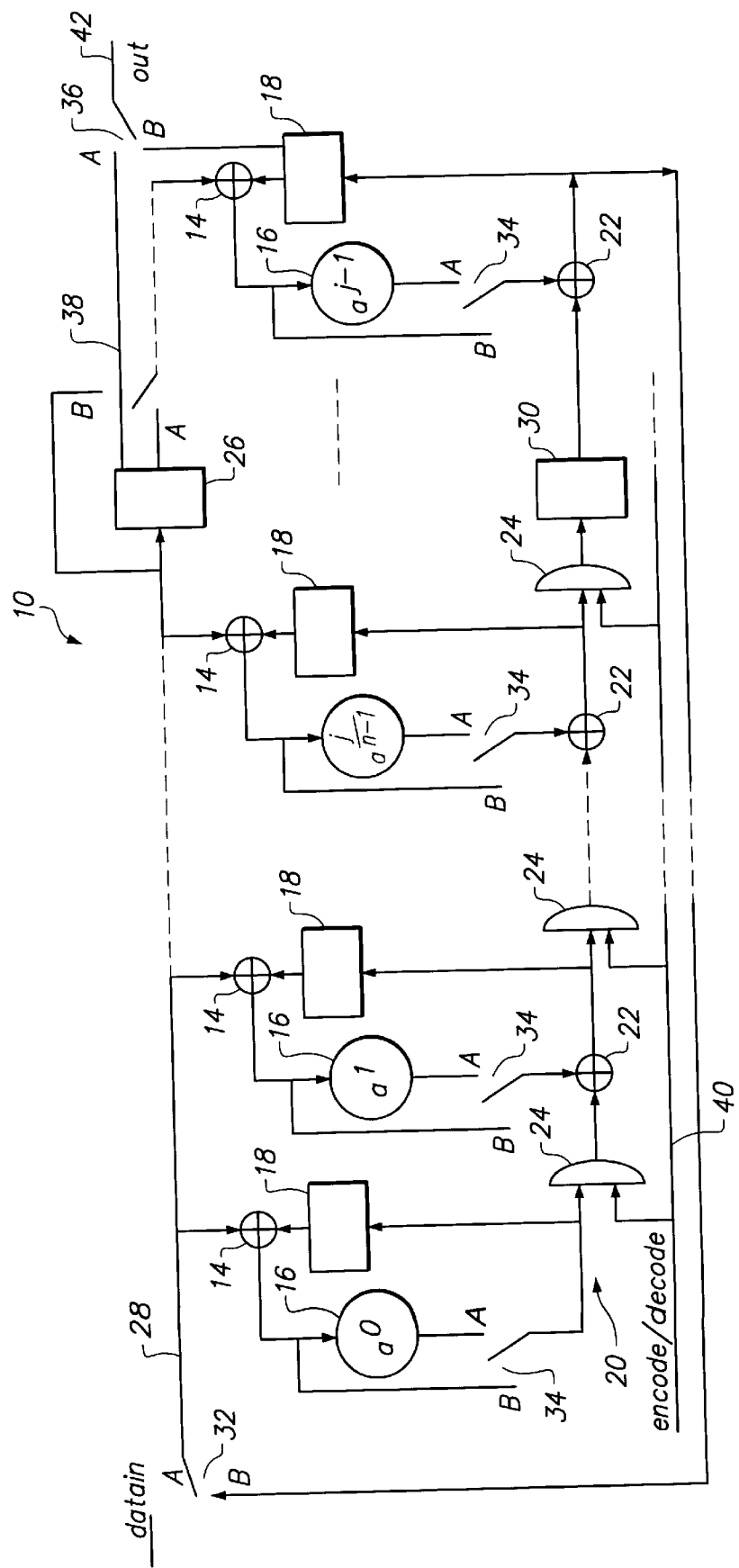
FIG. 3 is a functional block diagram of the system of FIG. 2 with additional switches.

Referring now to FIG. 3, the system 10 may include switches 34 that are used during syndrome generation operations to bypass the multipliers 16 when the last data symbol is supplied to the system. With the switches 34 in position B, the updated sums associated with the last data symbol are supplied directly to the registers 18 and the syndrome generation operation is complete. If the switch 34 is omitted from the system, the operation includes an additional multiplication operation, and the resulting error syndromes indicate error locations that are adjacent to the actual error locations.

All of the stages $12_i$ of FIGS. 1 and 2 are identical, with the exception of the first stage $12_0$, which includes the switch 32, and the last stage $12_{n-1}$, which includes the switch 36 and in which one or both of the delay circuits 26 and 30 may be omitted. As discussed, the delay circuits $26_{n-1}$ and $30_{n-1}$ in each stage ensure that the symbols and the corresponding sum propagate together through the system during encoding operations. During syndrome generation operations, the delay circuits 26 in the data input line 28 are bypassed and the chain of feedback adders is broken by the AND gates 24 such that every update adder receives the same data symbol in the same clock cycle. Accordingly, both the encoding and the syndrome generation operations are optimized.

With identical stages, the hardware may be readily configured to handle ECC codes of any length, with pipelined stages that during encoding require a predetermined time to propagate the associated sum through each of the stages. The system thus eliminates the latency problem that was discussed in the Fettweis-Hassner article by giving the system designer the ability to set the length of the time lag between the encoding of the last data symbol and the availability of the ECC symbols.

The foregoing description has been limited to a specific embodiment of this invention. It will be apparent, however, that variations and modifications may be made to the invention, such as the delay circuits may be flip-flops and the switches may be multiplexers, with the attainment of some or all of its advantages. Therefore, it is the object of the appended claims to cover all such variations and modifications as come within the true spirit and scope of the invention.

What is claimed is:

1. A pipelined system for manipulating data symbols in accordance with the roots of a generator polynomial to produce "j" error correction symbols and j error syndromes, the system having n stages and in each stage including:
   A. j/n registers;
   B. j/n update adders for adding the contents of the registers to a next data symbol to produce update sums;
   C. j/n Galois Field multipliers that, respectively, multiply the update sums by j/n associated roots of the generator polynomial;
   D. a feedback path that includes j/n feedback adders and j/n gates that during encoding operations operate as a chain to pass a propagating sum through the feedback adders, with each feedback adder adding the product produced by the associated Galois Field multiplier to the propagating sum provided by the previous gate and providing the result to the associated register and to a next gate;
   E. in all stages except the last stage, first and second delay circuits, the first delay circuit holding a data symbol for a clock cycle and the second delay circuit holding a corresponding propagating sum produced in the clock cycle by a last feedback adder in the stage, the delay circuits providing the data symbol and the corresponding propagating sum to a next stage during the next clock cycle; and
   F. in the first stage, a switch for providing to the update adders in the first stage the data symbols or the sum produced by the last feedback adder in the last stage.

2. The system of claim 1 wherein the gates are AND gates that during syndrome generation operations prevent the sums produced by the feedback adders from passing to successive feedback adders.

3. The system of claim 2 further including in each stage except the last stage a data symbol switch that passes the data symbol to the first delay during encoding operations and bypasses the first delay during syndrome generation operations.

4. The system of claim 3 further including in each stage j/n update sum switches that bypass the Galois Field multipliers with the update sum associated with the last data symbol.

5. The system of claim 2 wherein the AND gates operate during syndrome generation operations to pass zero-valued signals to the feedback adders.

6. The system of claim 1 wherein one or both of the first and second delays are included in the last stage of the system.

7. A pipelined system for manipulating data symbols in accordance with the roots of a generator polynomial to produce "j" error correction symbols and j error syndromes, the system having n stages and in each stage including:
   A. j/n update adders, each adder for including a given data symbol in an update sum;
   B. j/n Galois Field multipliers for multiplying the update sum by coefficients of the generator polynomial to produce corresponding products;
   C. j/n feedback adders interconnected into a chain by j/n gates, the feedback adders propagating through the chain a sum that corresponds to the given data symbol and includes the products produced by the multipliers;
   D. a first delay circuit for holding the given data symbol until the corresponding sum propagates through the chain of j/n feedback adders;
   E. a second delay circuit for holding the sum produced by the last feedback adder in the stage;
wherein the first and second delay circuits provide the given data symbol and the corresponding propagating sum to a next stage.

8. The system of claim 7 wherein the first and second delay circuits are included in all stages except the last stage.

9. The system of claim 8 wherein the first stage includes a switch for providing to the update adders in the first stage the data symbols or the sum produced by the last feedback adder in the last stage.

10. The system of claim 8 further including in each stage j/n update sum switches that bypass the Galois Field multipliers with the update sum associated with the last data symbol.

11. The system of claim 7 wherein the gates are AND gates that during syndrome generation operations prevent the sums produced by the feedback adders from passing to successive feedback adders.

12. The system of claim 11 further including in each stage except the last stage a data symbol switch that passes the data symbol to the first delay during encoding operations and bypasses the first delay during syndrome generation operations.

13. The system of claim 10 wherein the AND gates operate during syndrome generation operations to pass zero-valued signals to the feedback adders.

14. The system of claim 7 wherein the first and second delays are included in all stages except the last stage.

* * * * *

UNITED STATES PATENT AND TRADEMARK OFFICE
CERTIFICATE OF CORRECTION

PATENT NO. : 6,226,772 B1      Page 1 of 1
DATED : May 1, 2001
INVENTOR(S) : Weng et al.

It is certified that error appears in the above-identified patent and that said Letters Patent is hereby corrected as shown below:

Column 8, claim 13,
Line 51, replace "10" with -- 11 --.

Signed and Sealed this

Fifth Day of March, 2002

Attest:

JAMES E. ROGAN
Attesting Officer     Director of the United States Patent and Trademark Office